United States Patent [19]

Schulz-Harder et al.

[11] Patent Number: 5,465,898
[45] Date of Patent: Nov. 14, 1995

[54] PROCESS FOR PRODUCING A METAL-CERAMIC SUBSTRATE

[76] Inventors: Jurgen Schulz-Harder, Hugo-Dietz-Strasse 32, D-91207 Lauf; Peter H. Maier, Hugo-Dietz-Strasse 19, D-19207 Lauf, both of Germany

[21] Appl. No.: 250,904

[22] Filed: May 31, 1994

[30] Foreign Application Priority Data

Jun. 1, 1993 [DE] Germany .................. 43 18 061.2

[51] Int. Cl.⁶ .................................................. B23K 1/008
[52] U.S. Cl. ...................... 228/122.1; 228/903; 428/632
[58] Field of Search ................... 419/8; 228/122.1, 228/903, 198; 428/632

[56] References Cited

U.S. PATENT DOCUMENTS 3,994,430  11/1976  Cusano et al. .................. 228/122.1
4,860,939   8/1989  Guinet et al. ................... 228/122.1

FOREIGN PATENT DOCUMENTS 0299136  2/1988  European Pat. Off. .
2306236  2/1973  Germany .
4103294  2/1991  Germany .

*Primary Examiner*—Kenneth J. Ramsey
*Attorney, Agent, or Firm*—Hoffman, Wasson & Gitler

[57] ABSTRACT

A process is provided where a ceramic metal substrate is produced by attaching metal foils on either side a ceramic layer to form metal layers and for producing a through connection by placing metal in an opening to form a bridge so that the metal layers are electrically connected together by direct bonding, and a metal body is inserted into the opening to almost fill it, while a surface of the metal body is provided with a layer with chemical compound of metal and reactive gas.

12 Claims, 5 Drawing Sheets

PROCESS FOR PRODUCING A METAL-CERAMIC SUBSTRATE

FIELD OF THE INVENTION

The invention relates to process for producing a ceramic-metal substrate and in this case especially for producing one such substrate with at least one through connection.

BACKGROUND OF THE INVENTION

Production of metal-ceramic substrates which have on one or both surface sides of a ceramic layer one metal layer each, for example, a copper layer, by means of the so-called direct bonding technique (DCB technique or process) which is also called the direct copper bonding technique or DCB technique, in metal layers of copper is known. In this process described, for example, in U.S. Pat. No. 3,744,120 or DE-PS 23 19 854 the bond is produced between the ceramic layer and a metal foil or board which forms the respective metal layer by the fact that the board on its surfaces has a layer or a coating (fused-on layer) of a chemical compound consisting of the metal and a reactive gas, preferably oxygen, that after placing the metal foil or board on one surface side of the ceramic layer this arrangement of ceramic and metal is heated to a process temperature which is above the eutectic temperature of the chemical bond between the metal and reactive gas, but below the melting point of the metal so that a liquid phase is formed on the outside surface of the metal foil or board (on the fused-on layer) via which then the bond with the ceramic takes place.

In electrical circuit engineering through connections which establish electrical connections, for example, between printed circuits, contact surfaces etc. from two different sides of a substrate are often required.

These through connections are common, for example, in circuit board engineering and are produced there, for example, by chemical and/or galvanic means by copper or other suitable materials. This technique is limited to relatively low currents and is little suited in particular to power circuits with high currents.

To produce printed circuits use of conductive or silk screen printing pastes which contain a metal and a binder and which form printed circuits from the substrate after application to a substrate and after burning-in at a temperature between 600°–900° C. is known from hybrid engineering (DE-PS 34 34 449). These pastes can also be pressed into connection channels or windows in the substrate during application so that in this way through connections are obtained.

The disadvantage here is the low conductivity of the electrical printed circuits and connections or through connections produced with these pastes. These conductive pastes used in hybrid engineering must be burned-in generally in air. These pastes are therefore not suitable for producing metal-ceramic substrates using the DCB technique, since the DCB process must be carried out in a protective gas atmosphere. Furthermore, the coefficient of thermal expansion of a burned-in conductive or silk-screen printing paste differs significantly from the coefficient of thermal expansion of a massive metal layer. Since metal-ceramic substrates are used for electrical power circuits or modules and are exposed there to very frequent cyclic temperature loads with extreme temperature differences these silk-screen printing pastes are fundamentally unsuited for through connections in ceramic-metal substrates which are produced according to the DCB process.

Finally, a process is also known (DE-PS 41 03 294) which is designed especially for producing through connections by means of the DCB process. In this known process a metal powder, preferably a copper powder which is designed to fuse on during the DCB process and join with the metal layers is introduced into the respective opening of the ceramic layer provided for the through connection in order to form an electrically conductive bridge which links the metal layers on the two surface sides of a ceramic layer. The disadvantage in this process is especially that the desired result can only be achieved with extremely accurate process control, in particular it can be ensured only with extremely accurate process control that the desired through connection or bonding with the required cross section actually takes place also on the two metal layers. Furthermore, the disadvantage in this process is also that the effective cross section of the through connection and thus the conductivity of this connection are limited at a stipulated size of the opening or window. Since the through connection or bridge is essentially shaped like a sleeve or hollow cylinder the electrically effective cross section of this bridge is therefore only a fraction of the window cross section.

SUMMARY OF THE INVENTION

The problem of the invention is to devise a process with which production of metal-ceramic substrates with at least one through connection according to the DCB process is easily possible.

To solve this problem, a process is provided where a ceramic metal substrate is produced by attaching metal foils on either side of the ceramic layer to form metal layers and producing a through connection by placing metal in an opening to form a bridge so that the metal layers are electrically connected together by direct bonding and a metal body is inserted into the opening to almost fill it while a surface of the metal body is provided with a layer of chemical compound of metal and reactive gas.

In the process according to the invention, to produce the through connection, into the opening or the window of the ceramic layer a massive metal body is inserted which has on its surface likewise the chemical compound of metal and reactive gas (fused-on layer) and which can therefore be connected by means of the DCB process with the metal foils or boards which form the metal layers so that this metal body then forms an electrically conductive bridge with an effective cross section which is the same or almost the same as the cross section of the opening or window in the ceramic layer.

The metal bodies can be produced economically and simply, for example, by punching (for example, cylinders) and subsequent mill grinding (for example, spheres).

The fused-on layer produced from the chemical compound consisting of the metal and reactive gas has for example a thickness of 5–30 microns on the metal foils or boards and on the metal bodies.

The advantages of the process according to the invention are among others unproblematic process control, guarantee of a reliable through connection with large effective cross section and thus with high conductivity, and also hermetic sealing of the through connection on both metal layers joined via this connection.

In the simplest case the metal-ceramic substrate produced with the process according to the invention consists of a ceramic layer which is provided on its two surface sides each with at least one metal layer. Basically, however, it is also possible to produce metal-ceramic substrates with the process according to the invention which have two or more than two ceramic layers with metal layers arranged in between each, at least one through connection being provided then in the area of at least one ceramic layer.

If the metal-ceramic substrate has several ceramic layers with at least one through connection each, these connections are produced by inserting metal bodies into the respective openings or windows in a common process step or successively in several consecutive process steps.

Developments of the invention are the subject matter of the subclaims.

DETAILED DESCRIPTION OF THE DRAWINGS

The invention is detailed below using the figures on examples of embodiments.

Figure 1:
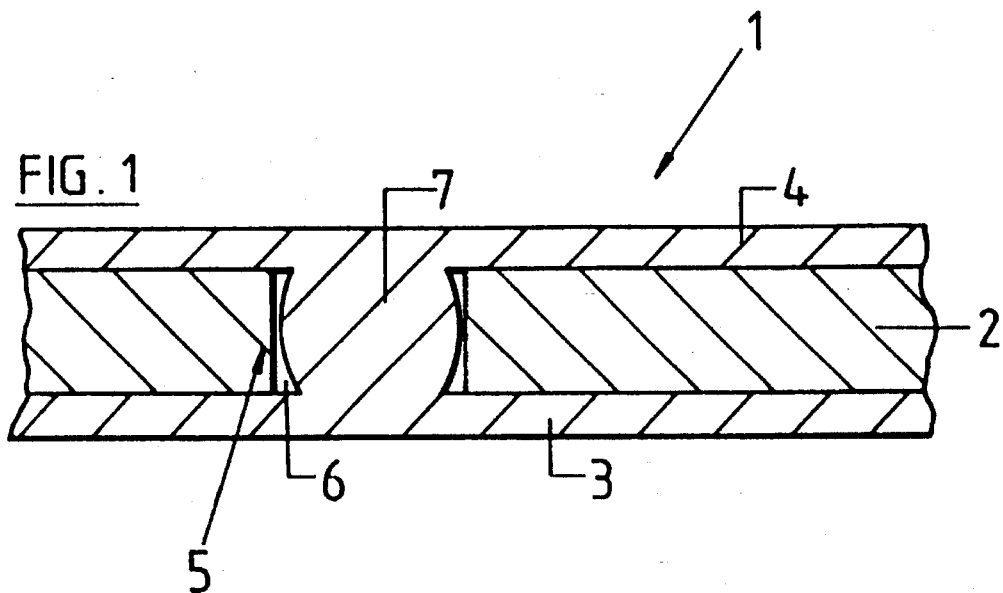
FIG. 1 shows in an enlarged partial representation a ceramic substrate with a through connection produced according to the process according to the invention.
Figure 2:
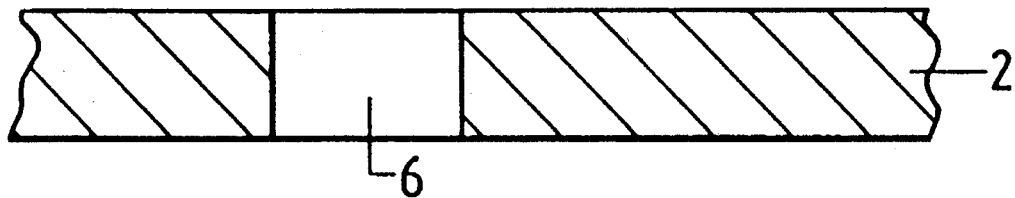
FIGS. 2 through 7 show different process steps in the manufacture of the ceramic substrate with a least one through connection.
Figure 8:
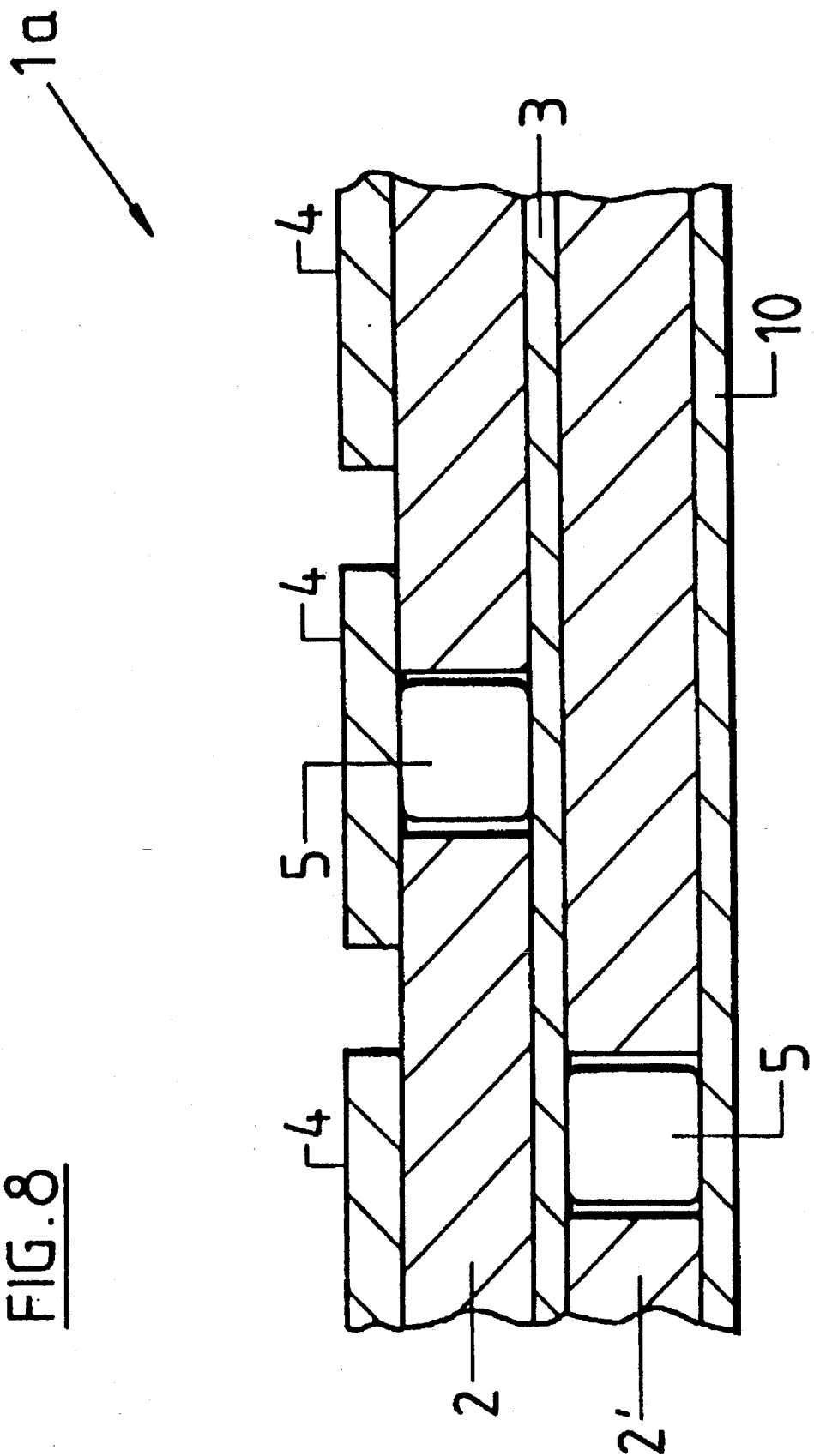
Figure 9:
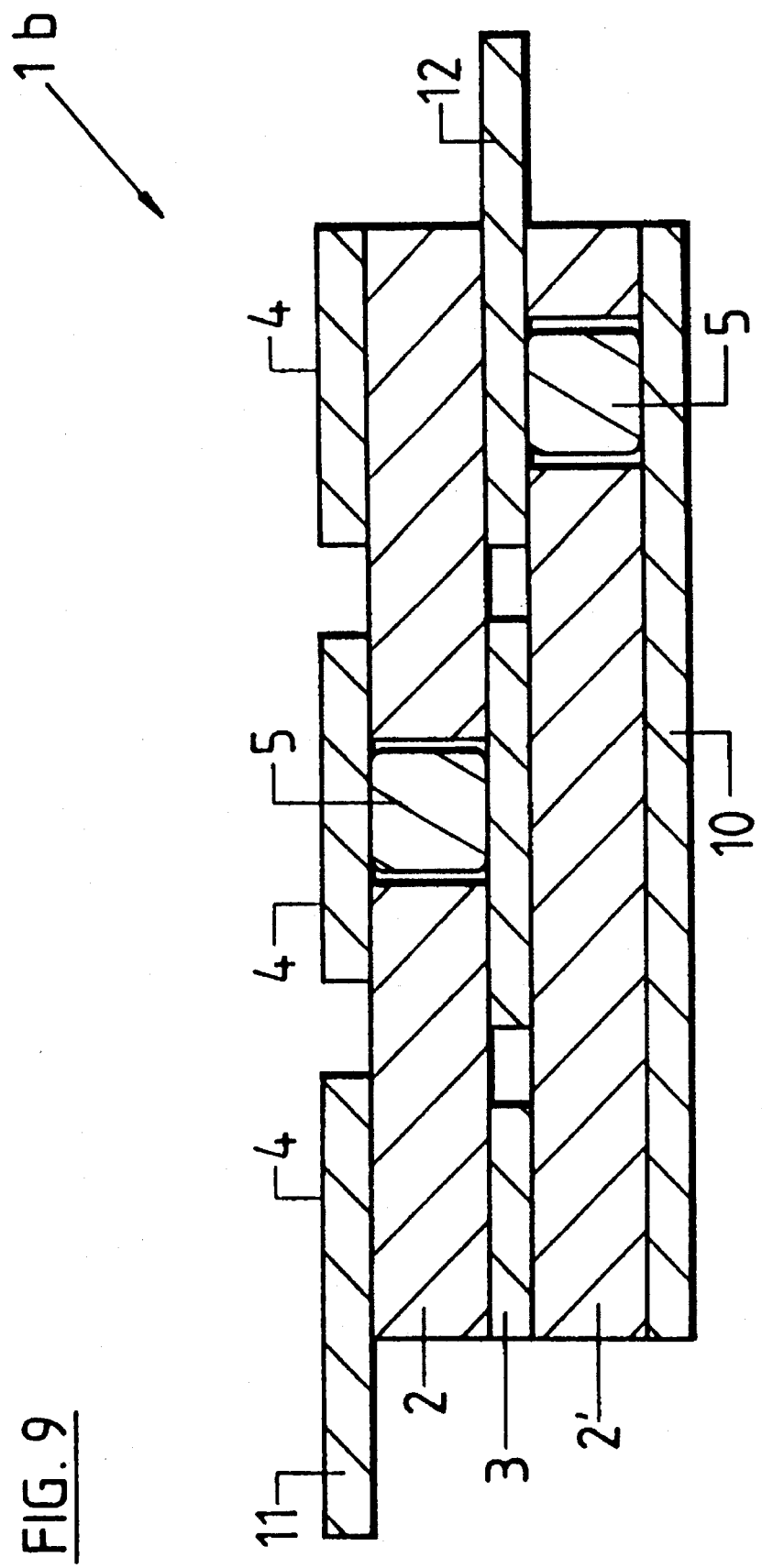
Figure 10:
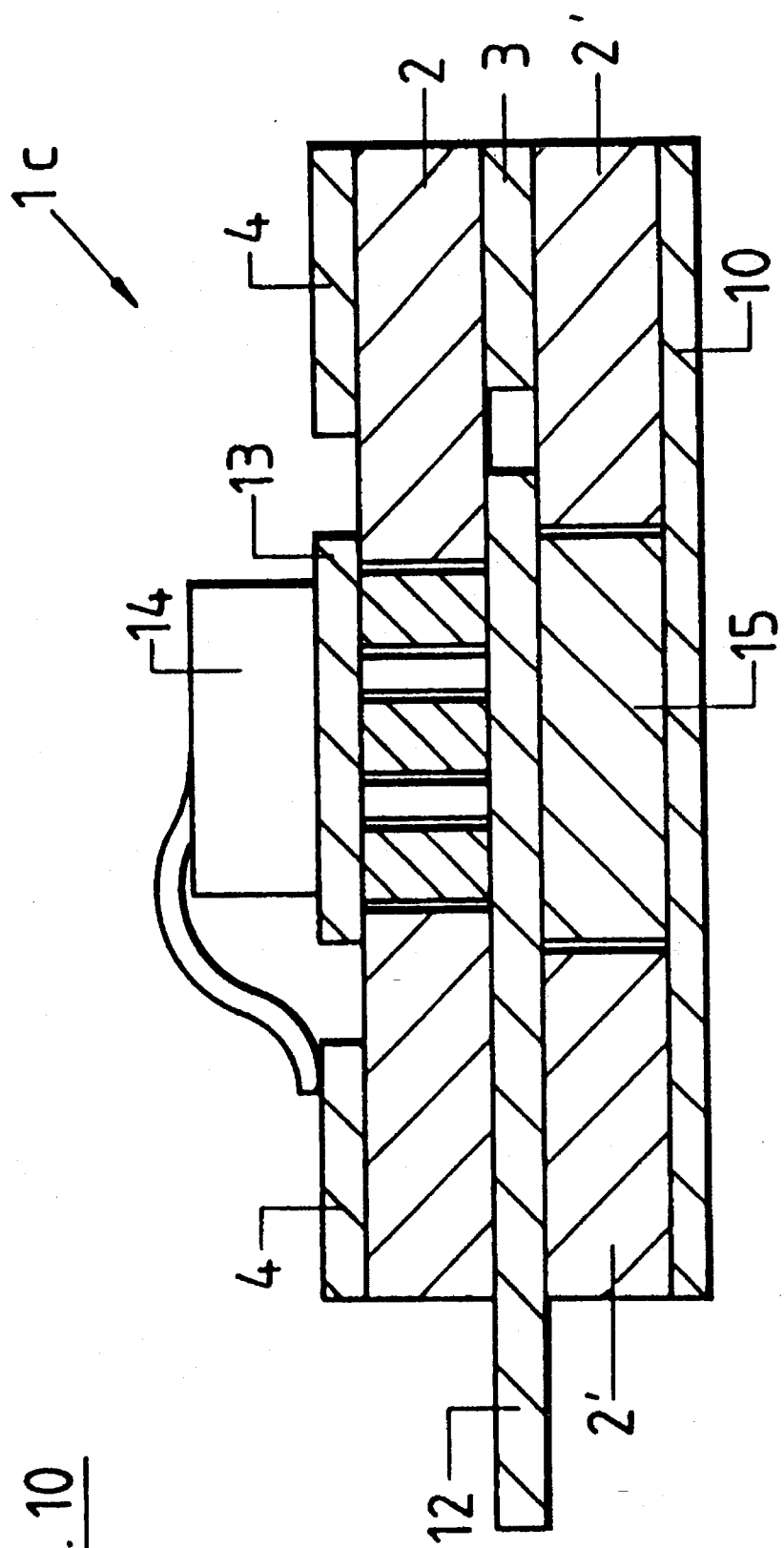

FIGS. 8 through 10 in a representation like FIG. 1 show additional substrates produced according to the invention.

DETAILED DESCRIPTION OF THE PREFERRED EMBODIMENTS

In the figures, 1 is a ceramic substrate for an electrical circuit, preferably for a power circuit or a power module. Substrate 1 consists in the embodiment shown of ceramic layer 2 which is for example an aluminum oxide ceramic or an aluminum nitride ceramic. One copper layer 3 or 4 each is applied to both surface sides of the ceramic layer in the so-called DCB technique (direct copper bonding technique) which is fundamentally known to one skilled in the art.

In the area of through connection 5, in ceramic layer 2 is a recess or opening 6 through which two copper layers 3 and 4 are joined to one another via massive bridge 7 of copper. The latter is executed such that it forms a uniform copper cross section which is roughly identical to the cross section of opening 6.

An electrical connection between generally structured copper layers 3 and 4 or between the printed conductors, contact surfaces, etc., formed by these copper layers is produced via bridge 7.

FIGS. 2 through 5 show in principle the process steps for producing substrate 1.

Figure 3:
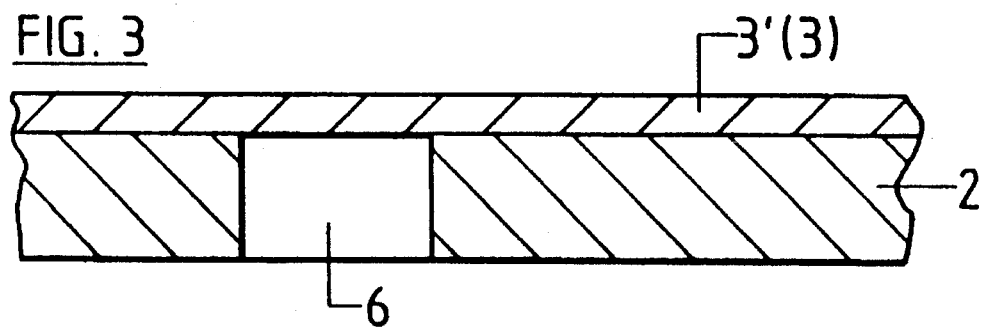

In a first process step at least one opening 6 is first made in ceramic layer 2, for example, by punching (of the green foils), laser cutting, or in some other suitable manner. Subsequently one of the two copper layers, for example, copper layer 3 which is the lower one in FIG. 3 is applied to one surface side of ceramic layer 2 provided with opening 6. For this reason copper board 3' which is preoxidized on its surface sides is placed on one surface side of ceramic layer 2. Then the arrangement shown in FIG. 3 is heated in a protective gas atmosphere to a process temperature which is above the eutectic temperature of the copper-oxygen system, but below the melting point of the copper of copper board 3' and held at this process temperature for a certain time interval so that the desired bond between ceramic layer 2 (aluminum oxide ceramic) and copper board 3' is achieved.

After cooling of the intermediate product obtained in this way consisting of ceramic layer 2 and copper layer 3 provided on one surface side of the ceramic layer, the intermediate product is turned and a massive copper body 8 which forms later bridge 7 is inserted into recess 6 then open at the top. In the embodiment shown in FIGS. 4 and 5 this copper body is made like a round plate.

Copper body 8 was oxidized on its entire surface by heating to a preoxidation temperature, for example, to a temperature of 450° C., by insertion in recess 6 in another process step not shown in an oxygen-containing atmosphere, for example, in air. Preoxidation can also take place using wet chemical means, for example in commercial black oxide baths. After its preoxidation copper body 8 is inserted into respective recess 6.

If substrate 1 is to be provided with several through connections 5 and accordingly ceramic layer 2 has a host of openings 6 into which one copper body 8 is to be inserted at a time, this insertion can take place in an especially efficient manner and in doing so especially also in a device by scattering a certain number of copper bodies 8 on the top of ceramic layer 2, the top being located in a horizontal plane or in an essentially horizontal plane, the ceramic layer having on this top open openings 6 and on its bottom copper layer 3. By means of a suitable technique, for example, by shaking and/or vibrating and/or by another suitable movement of ceramic layer 2 or a carrier or table bearing this layer the scattered copper bodies 8 are then distributed such that in each opening 6 is one such copper body. This distribution or introduction of copper bodies 8 into openings 6 can also take place or be supported by scraper- or broom-like elements which are moved over the top of ceramic layer 2.

Subsequently those copper bodies 8 which are not accepted by recess 6 are removed, for example, by tilting ceramic layer 2 and/or by broom or slide-like striper elements and/or by blowing off, etc.

Figure 4:
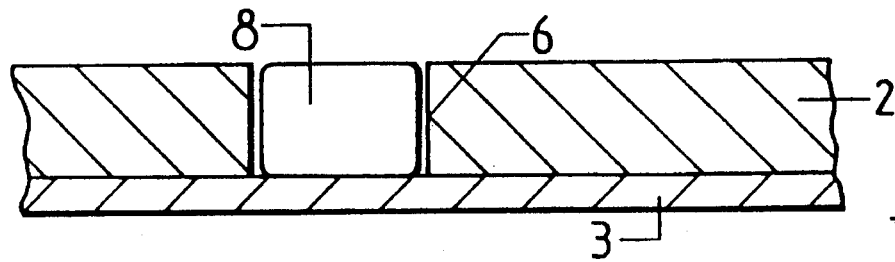
Figure 5:
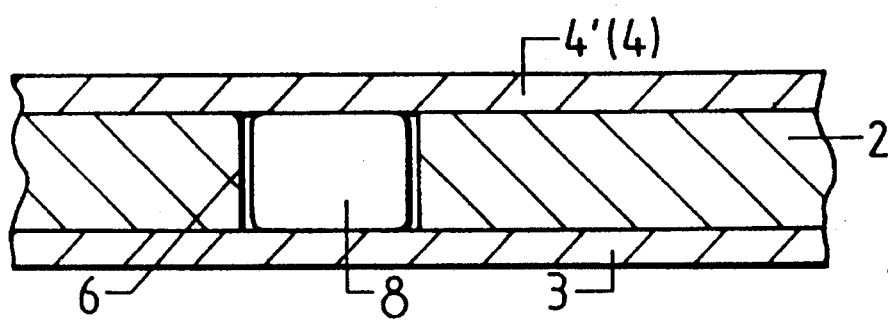

Copper bodies 8 are selected with their dimension and are matched to the thickness of ceramic layer 2 such that each copper body accepted in one opening 6 lies with its top flush with the top of ceramic layer 2, as shown in FIG. 4.

In a next process step a copper board 4' which forms later copper layer 4 is placed which has likewise been preoxidized beforehand on its surface sides and again, for example, in air at a preoxidation temperature of roughly 450° C. After placing copper board 2' the arrangement is heated again in a protective gas atmosphere to the process temperature which is again above the eutectic temperature of the copper oxide but below the melting point of the copper of copper board 4'. This process temperature is for example on the order of roughly 1070° to 1075° C. After the process temperature has been maintained for a stipulated period of time which is selected to be long enough both for producing the flat bond between copper board 4' and ceramic layer 2 and also for a flat bond between copper body 8 and copper boards 3' and 4' or the corresponding copper layers, the product obtained or substrate 1 is cooled.

In the embodiment described above it was assumed that copper bodies 8 which can be produced especially easily by punching from a suitable copper material (copper sheet) have the shape of a round plate. Of course it is also possible to select different shaping for these copper bodies, for example, these copper bodies can be made cuboid.

However, copper bodies 8' in spherical form which can be distributed especially easily by shaking or vibration technique among individual openings 6 are especially advantageous.

Figure 6:
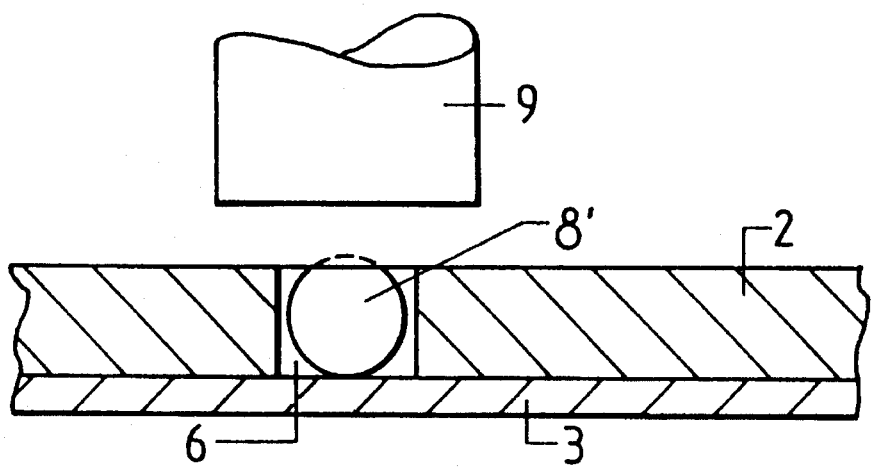
Figure 7:
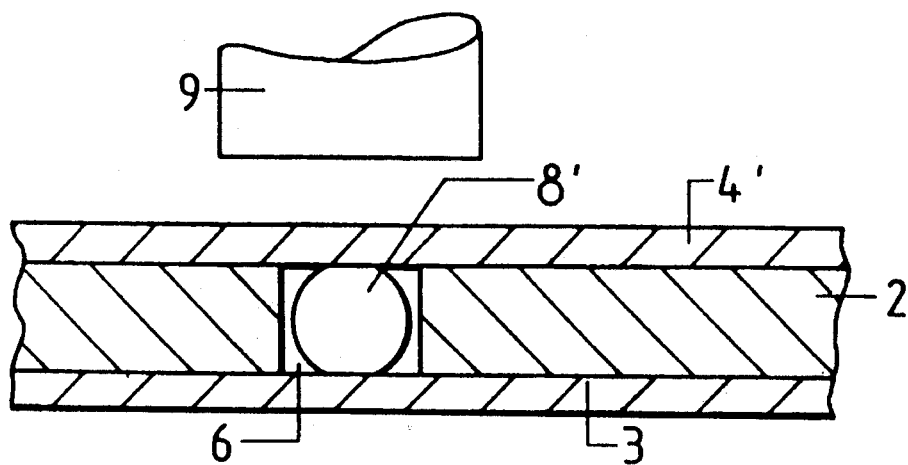

FIG. 6 and 7 show copper bodies 8' formed as spheres with other fundamental modifications of the process according to the invention.

In the modified process shown in FIG. 6 the spherical copper bodies 8 of course preoxidized again on their surface, with a diameter somewhat greater than the thickness of ceramic layer 2, are pressed flat after insertion into respective opening 6 by a die such that copper body 8' then has the required height.

Copper body 8' is pressed flat for the copper body inserted into respective opening 6, the copper body resting with its bottom on copper board 3' or on copper layer 3 formed by this board.

FIG. 7 shows schematically another modification of the production process. For through connection 5 spherical copper bodies 8' are again used. The respective copper body 8' is pressed flat after copper board 4' is placed on the surface of ceramic layer 2 and before bonding copper board 4', again using die 9.

Deviating from the process shown in FIGS. 6 and 7 it is also possible to exactly match copper bodies 8 and 8' outside of openings 6 to the thickness of ceramic layer 2 in a forming and sizing tool by permanent deformation in height.

The process can be configured such that with it a multilayer substrate which has several ceramic layers 2 is produced which has at least one massive through connection, in which the ceramic layers can consist of different ceramics. Furthermore, the substrate can also be produced such that it has connections which have been brought out, regardless of the number of ceramic layers and/or through connections. At least one through connection can also be used as a heat bridge, for example, to dissipate heat from one metal layer to another metal layer. These corresponding versions or modifications are shown in FIG. 8–10.

FIG. 8 shows multilayer substrate 1a which consists of two layers, an upper layer which comprises ceramic layer 2 which is, for example, an aluminum oxide ceramic, the upper structured copper layer 4 and the lower, likewise structured copper layer 3. Multilayer substrate 1a consists furthermore of a second layer which comprises second ceramic layer 2' and copper layer 10. The latter is joined flat to the lower surface side of ceramic layer 2'. The top of ceramic layer 2' which is, for example, an aluminum nitride ceramic, is joined flat to the bottom of lower copper layer 3 so that the latter form a middle copper layer, i.e., a copper layer located in the substrate between ceramic layers 2 and 2'. Substrate 1a has at least two through connections 5, one each between copper layer 3 and upper copper layer 4 or lower copper layer 10.

FIG. 9 shows in a representation similar to FIG. 8 multilayer substrate 1b which differs from multilayer substrate 1a of FIG. 8 essentially by the fact that upper copper layer 4 and copper layer 3 each form connections 11 and 12 which are brought out laterally from the substrate.

FIG. 10 shows in a similar representation multilayer substrate 1c in which upper structured copper layer 4 at 13 forms a contact surface on which power semiconductor component 14 is located. Otherwise, upper structured copper layer 4 forms at least partially printed circuits which are used among others to trigger power component 14, but which are also partially a constituent of the output or power circuit of this component.

Copper layer 3 in turn has connection 12 and is likewise a constituent of the output or power circuit of component 14. For this reason copper layer 3 is electrically connected by several through connections 5 to contact surface 13.

Ceramic layer 2' under contact surface 13 consists of an aluminum nitride ceramic with high thermal conductance. This area is labelled 15. Otherwise ceramic layer 2' consists of an aluminum oxide ceramic. Via copper layer 10 multilayer substrate 1c or the power module formed by this substrate is connected to a copper carrier plate not shown which for its part is mounted on a heat sink to dissipate the heat loss of power component 14. Through connections 5 are used in multilayer substrate 1c both as electrical connections and also heat conducting bridges in order to transmit the heat loss of component 14 from contact surface 13 to copper layer 3 from which heat loss is dissipated to copper layer 10 via area 15.

Below the production of substrate 1 with at least one through connection 5 is detailed using examples.

EXAMPLE 1

1. Preoxidation of the first copper board, for example, copper board 3' with a thickness of 0.3 mm for 8 minutes at 450° C. in air;

2. Placing preoxidized copper board 3' on ceramic layer 2 of $Al_{O3}$ ceramic with a thickness of 0.63 mm and with holes or openings 6 with a diameter of 1.1 mm;

3. Heating of ceramic layer 2 provided with copper board 3' in a nitrogen atmosphere with 5 ppm $O_2$ content for 15 minutes to a process temperature of 1072° C.;

4. Holding ceramic layer 2 and copper board 3' at the process temperature of 1072° C. for 2 minutes;

5. Cooling of the intermediate product within 15 minutes;

6. Preoxidation of round plate-shaped copper body 8 with a 1 mm cross section at 450° C. in air for 8 minutes to attain a copper oxide layer;

7. Preoxidation of the second copper board, for example, copper board 4' with a thickness of 0.3 mm at 450° C. in air for 8 minutes;

8. Insertion of preoxidized copper bodies 8 into one opening 6 each;

9. Placement of preoxidized copper board 4' on ceramic layer 2;

10. Heating of the ceramic layer with the copper boards in a nitrogen atmosphere with an $O_2$ content of 5 ppm to 1072° C. within 18 minutes;

11. Holding the process temperature of 1072° C. for roughly 2 minutes;

12. Cooling substrate 1 within 18 minutes.

The result of this process was a substrate with complete through connection 5, i.e., with a complete uniform copper connection or bond both in the area of the through connection and also at the transition between the copper and ceramic.

EXAMPLE 2

In this example, instead of the round plate-shaped copper body, copper body 8' in the form of a sphere with a diameter of 0.8 mm was used.

Process steps 1–5 in this example correspond to process steps 1–5 of example 1, preoxidation of copper body 8' formed as a sphere taking place in the 6th process step, again at 450° C. in air and for 8 minutes.

Process steps 7 and 8 in this example correspond to process steps 7 and 8 of example 1.

Deformation or pressing of spherical copper body 8' to a height of 0.7 mm takes place as the 9th process step.

Process steps 9–12 of example 1 then follow as the further process steps 10–13.

The process according to the invention can be applied not only to aluminum oxide ceramics, but also to other ceramics.

EXAMPLE 3

In this example ceramic layer 2 of an aluminum nitride ceramic was used.

1. As the first process step preoxidation of one of the two copper boards, for example, copper board 3' with a thickness of 0.3 mm for 8 minutes at 450° C. in air was done again.

2. Oxidation of ceramic layer 2 of aluminum nitride ceramic at 1200° C. in air for 1 hour.

3 through 14. These process steps then correspond to process steps 2–13 of example 2.

EXAMPLE 4

In this example a multilayer substrate was produced.

1–13. Process steps 1–13 of example 3';

14. Etching of the layout of the first layer;

15. Oxidation of the substrate with the etched layout;

16–21. Production of the second layer according to process steps 1–5 of example 1 using ceramic layer 2';

22. Preoxidation of round plate-shaped copper body 8;

23. Insertion of copper body 8 into opening 6 of ceramic layer 2';

24. Placement of the first layer produced according to process steps 1–15;

25. Heating of the two layers in a protective gas atmosphere, for example, a nitrogen atmosphere with a $O_2$ content of 5 ppm to 1072° C. within 18 minutes;

26. Holding the process temperature of 1072° C. within a period of roughly 2 minutes.

27. Cooling of multilayer substrate 1a–1c within 18 minutes.

The invention was described above using examples of embodiments. It goes without saying that changes and modifications are possible without departing from the inventive idea underlying the invention.

List of reference numbers
1 Substrate
2 Ceramic layer
2' Ceramic
3 Copper layer
3' Copper board
4 Copper layer
4' Copper board
5 Through connection
6 Opening
7 Copper bridge
8, 8' Copper body
9 Die
10 Copper layer
11, 12 Connection
13 Contact surface
14 Component
15 Area

What is claimed is:

1. A process for producing a ceramic metal substrate having at least one ceramic layer (2) and at least two metal layers (3, 4) disposed one each on either side of said ceramic layer (2) and at least one electric through connection (5) where said at least two metal layers (3, 4) are connected to one another by a metal bridge (7) at an opening (6) in said at least one ceramic layer, comprising the steps of:

attaching metal foils (3', 4') on said sides of said ceramic layer by a direct bonding process to form said at least two metal layers (3, 4), said metal foils having surfaces formed by a chemical compound and a reactive gas and producing said through connection (5) by placing metal, to form said bridge (7), in said opening (6) so that said at least two metal layers (3, 4) are electrically connected to one another by a direct bonding process, wherein a metal body (8, 8') is inserted into said opening (6) to almost completely fill said opening (6), a surface of said metal body being provided with a layer of chemical compound of metal and reactive gas.

2. A process according to claim 1, wherein during said attaching step said metal body (8, 8') with said at least two metal layers (3, 4) is joined simultaneously.

3. A process according to claim 1, further comprising the steps of:

attaching a metal foil (3') on one surface side of said ceramic layer (2), to form a first metal layer (3), inserting said metal body (8, 8') into said opening (6) from another surface side of said ceramic layer (2), placing a second metal foil (4') on said another surface side of said ceramic layer (2) to form a second metal layer (4), and joining by a direct bonding process said second metal foil (4') to said ceramic layer (2) and said metal body (8, 8') to said first and second metal layers (3, 4) on said one and another surface of said ceramic layer (2).

4. A process according to claim 1, further comprising the step of:

placing a metal body (8, 8') in each of multiple ones of said openings (6) in said ceramic layers (2) to form multiple through connections (5) said metal bodies being distributed by one of a shaking technique, a vibration technique, and using one of distribution and stripping elements.

5. A process according to claim 1, wherein said metal is copper.

6. A process according to claim 1, wherein reactive gas is oxygen.

7. A process according to claim 1, wherein said metal bodies (8, 8') are shaped like one of round plates, cuboids, and spheres.

8. A process according to claim 1, wherein said metal bodies (8, 8') have dimensions such that the height of metal bodies (8, 8') is equal to or slightly greater than a thickness of said ceramic layer (2).

9. A process according to claim 1, wherein said ceramic layer (2) is an aluminum oxide ceramic.

10. A process according to claim 1, wherein said ceramic layer (2) is an aluminum nitride ceramic which has preoxidized surface sides.

11. A process according to claim 1, wherein said metal body (8, 8') is permanently deformed to a dimension corresponding to a thickness of said ceramic layer (2) said deformation occurring at one of before, after, and before and after insertion into said opening.

12. A ceramic-metal substrate with at least one through connection, being manufactured with at least one massive through connection using a process according to claim 1.

* * * * *